(12) United States Patent
Kayano

(10) Patent No.: US 8,587,315 B2
(45) Date of Patent: Nov. 19, 2013

(54) MAGNETIC RESONANCE MEASURING APPARATUS

(75) Inventor: Hiroyuki Kayano, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 223 days.

(21) Appl. No.: 13/072,072

(22) Filed: Mar. 25, 2011

(65) Prior Publication Data

US 2012/0074936 A1    Mar. 29, 2012

(30) Foreign Application Priority Data

Sep. 24, 2010    (JP) ................................. 2010-214354

(51) Int. Cl.
*G01V 3/00*    (2006.01)

(52) U.S. Cl.
USPC .......................................... 324/318; 324/300

(58) Field of Classification Search
USPC ............................ 324/300–322; 600/407–445
See application file for complete search history.

(56) References Cited

U.S. PATENT DOCUMENTS

| | | | | |
|---|---|---|---|---|
| 3,173,084 | A * | 3/1965 | Anderson | 324/310 |
| 3,358,222 | A * | 12/1967 | Hyde | 324/300 |
| 4,521,753 | A * | 6/1985 | Schloemann | 333/204 |
| 4,543,543 | A * | 9/1985 | Blight et al. | 333/24.1 |
| 6,086,535 | A * | 7/2000 | Ishibashi et al. | 600/439 |
| 6,267,734 | B1 * | 7/2001 | Ishibashi et al. | 601/2 |
| 6,280,402 | B1 * | 8/2001 | Ishibashi et al. | 601/2 |
| 6,334,846 | B1 * | 1/2002 | Ishibashi et al. | 600/439 |
| 6,454,713 | B1 * | 9/2002 | Ishibashi et al. | 600/439 |
| 6,971,391 | B1 * | 12/2005 | Wang et al. | 128/846 |
| 7,573,432 | B1 * | 8/2009 | Eydelman et al. | 343/792 |

FOREIGN PATENT DOCUMENTS

| | | |
|---|---|---|
| JP | 59-105551 A | 6/1984 |
| JP | 7-270510 | 10/1995 |
| JP | 7-286979 A | 10/1995 |
| JP | 2002-246936 A | 8/2002 |
| JP | 2004-235812 A | 8/2004 |
| JP | 2006-258499 A | 9/2006 |
| JP | 2007-507719 A | 3/2007 |
| JP | 2007-101290 | 4/2007 |
| JP | 2008-151676 | 7/2008 |

OTHER PUBLICATIONS

Japanese Office Action Issued Aug. 21, 2012 in Patent Application No. 2010-214354 (with English translation).
U.S. Appl. No. 13/072,301, filed Mar. 25, 2011, Ishihara et al.

* cited by examiner

*Primary Examiner* — Brij Shrivastav
(74) *Attorney, Agent, or Firm* — Oblon, Spivak, McClelland, Maier & Neustadt, L.L.P.

(57) ABSTRACT

According to one embodiment, a magnetic resonance measuring apparatus includes a signal source, a transmitter, a receiver, a bandpass filter, a receiving circuit and a magnetic field generator. The signal generator is configured to generate a microwave signal. The transmitter is configured to transmit the signal from the signal source to a test sample. The receiver is opposed to the transmitter and configured to receive the signal from the transmitter via the sample. The bandpass filter has a bandwidth and is configured to extract the signal. The receiving circuit is configured to amplify the extracted signal through the bandpass filter and process the amplified signal. The magnetic field generator is configured to apply a magnetic field to the sample. The bandwidth satisfies a condition, $P+Gtx+Grx-(\Gamma tx+\Gamma d1+\Gamma d2+\Gamma d3+\Gamma rx)>10 \times \log(k \times T \times BW \times 10^9)$.

19 Claims, 10 Drawing Sheets

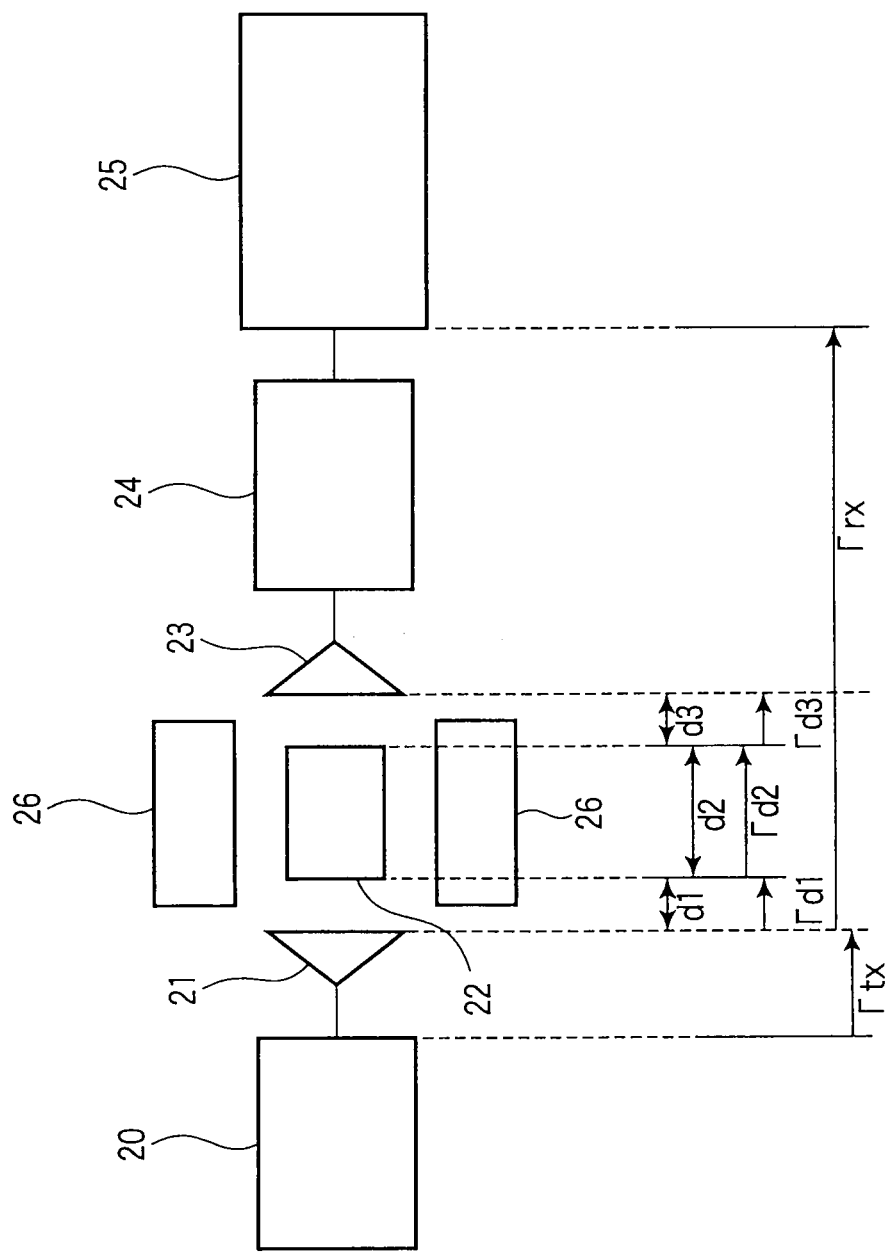
F I G. 1

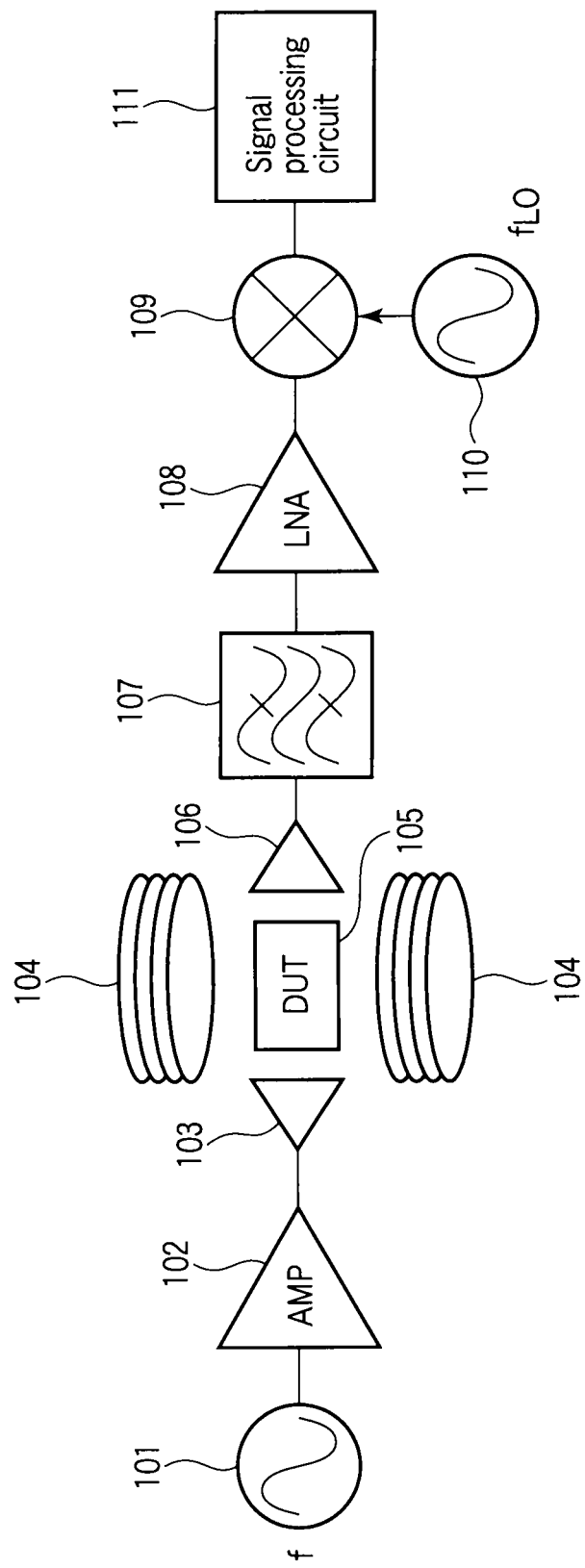
F I G. 2

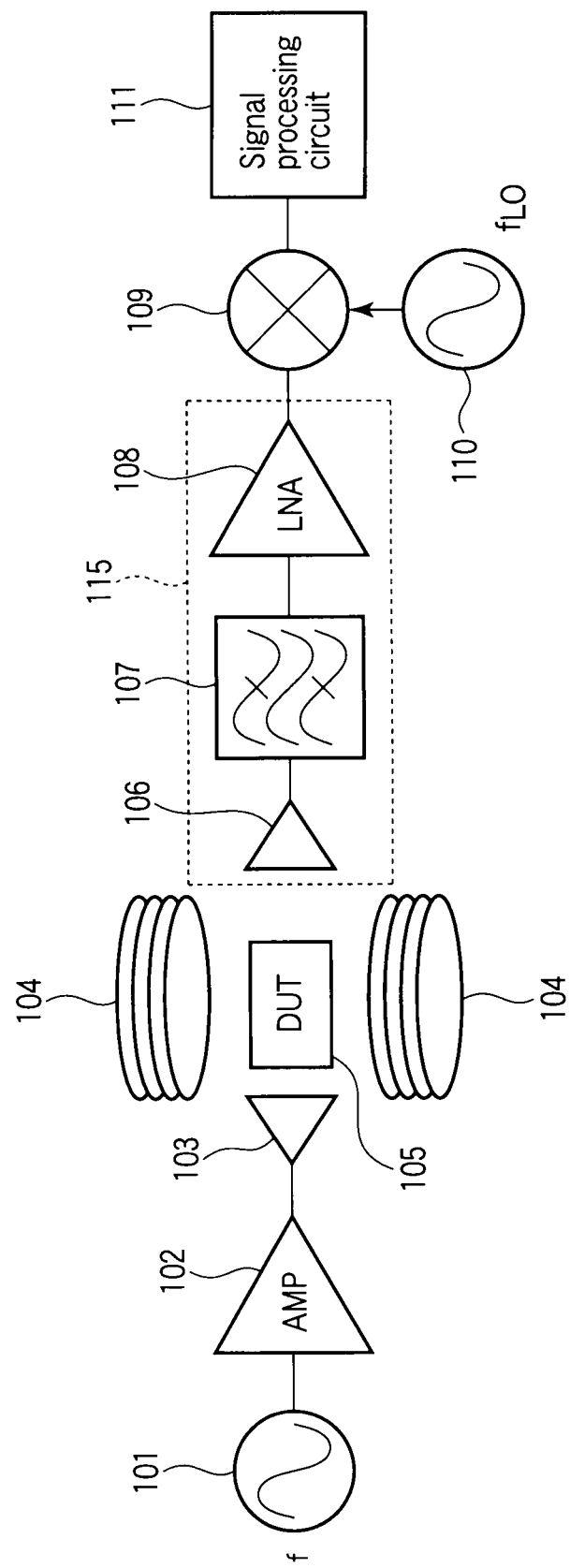
F I G. 8

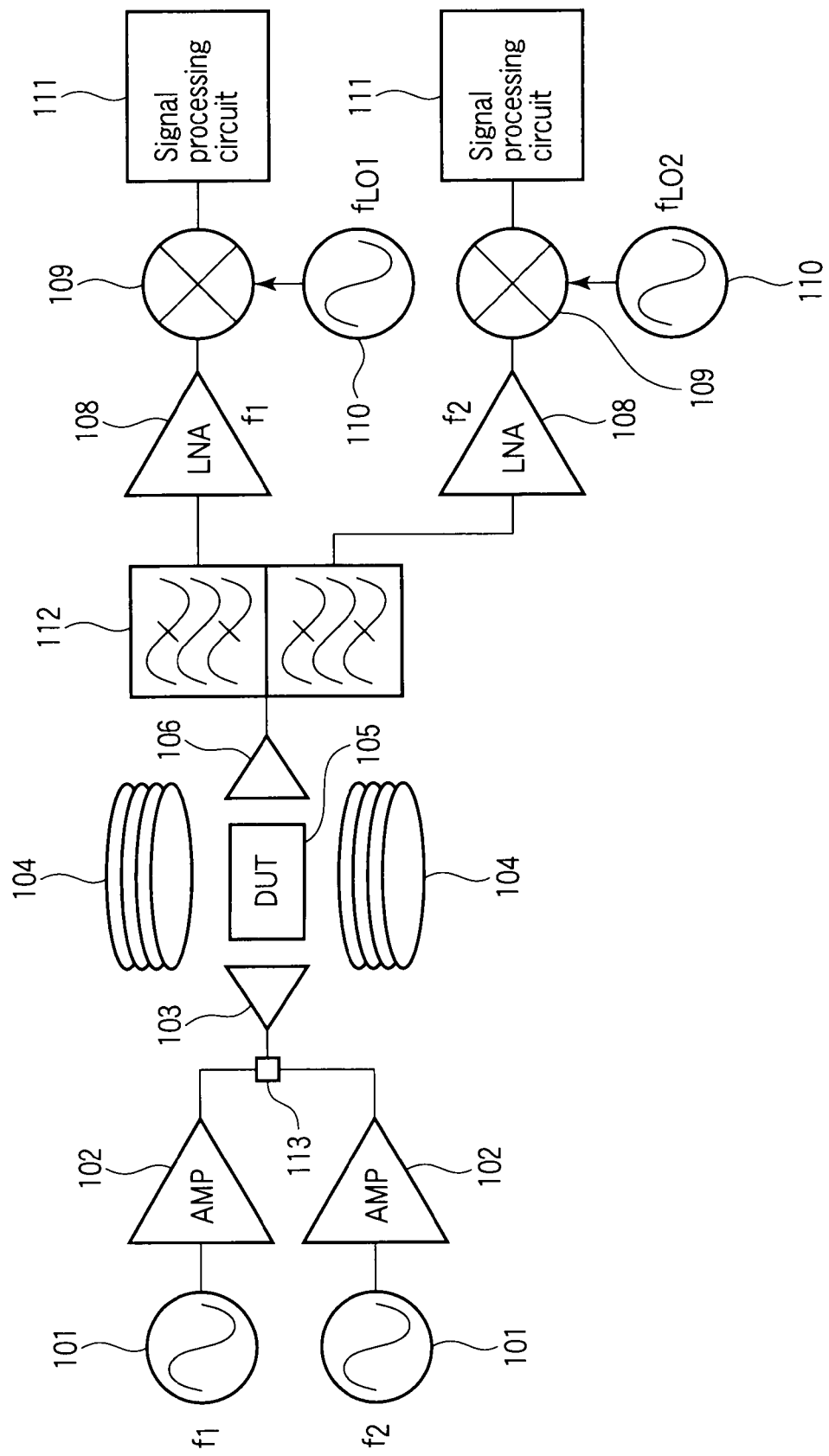
F I G. 9

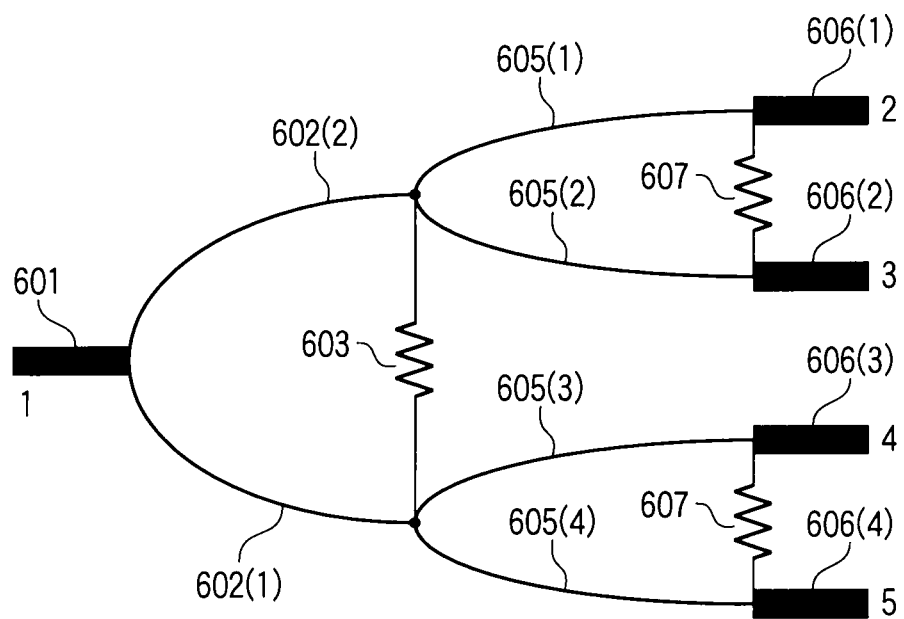
F I G. 10
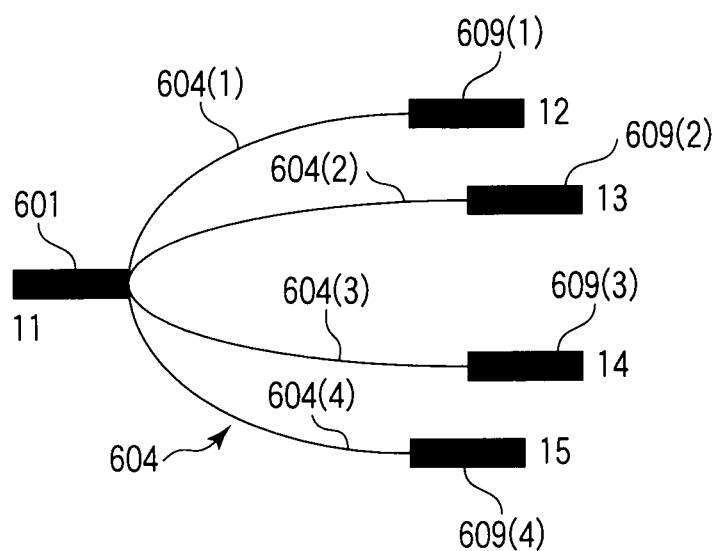
F I G. 11

MAGNETIC RESONANCE MEASURING APPARATUS

CROSS-REFERENCE TO RELATED APPLICATIONS

This application is based upon and claims the benefit of priority from Japanese Patent Application No. 2010-214354, filed Sep. 24, 2010; the entire contents of which are incorporated herein by reference.

FIELD

Embodiments described herein relate generally to a magnetic resonance measuring apparatus.

BACKGROUND

Conventionally, a magnetic resonance measuring apparatus is used to detect a substance that contains unpaired electrons. This measuring apparatus irradiates an object to be measured in a resonator with microwaves and measures resulting electrical spin resonance. Since the object is accommodated in the resonator, the measuring apparatus is subject to a number of restrictions. For example, the magnetic resonance measuring apparatus has the following problems. First, evaluable sizes depend on the size of the resonator. Secondly, the object to be measured can be evaluated at a single frequency only. Thirdly, the reception sensitivity is reduced depending on the bandwidth and a loss in coupling to the resonator.

Since a cavity resonator that resonates with a half-wavelength is used in a conventional magnetic resonance measuring apparatus, the half-wavelength is 15 cm or less even if the measurement frequency is in an L-band range (1 to 2 GHz). Consequently, only a small object to be measured can be accommodated in the resonator.

Conventionally, moreover, the loss in coupling to the resonator can be reduced by enhancing the coupling. Since the resonance characteristics become broad in this case, however, a large amount of noise enters a receiver system. If the coupling is reduced, in contrast, narrow-band characteristics can be obtained, so that the coupling loss increases although the noise that enters the receiver can be reduced. Thus, the reception sensitivity of the system is reduced.

BRIEF DESCRIPTION OF THE DRAWINGS

FIG. 1 is a schematic block diagram showing an example of a magnetic resonance measuring apparatus;

FIG. 2 is a schematic block diagram of a magnetic resonance measuring apparatus of a first embodiment;

FIG. 8 is a diagram showing a specific example in which the superconducting filter, the low-noise amplifier, and a receiver antenna of the magnetic resonance measuring apparatus of the first embodiment are simultaneously cooled;

FIG. 9 is a diagram showing a specific example in which a two-frequency signal source is used in a magnetic resonance measuring apparatus of a second embodiment;

FIG. 10 is a diagram showing a specific example of a power divider of the magnetic resonance measuring apparatus of the second embodiment;

FIG. 11 is a diagram showing another specific example of the power divider of the magnetic resonance measuring apparatus of the second embodiment;

DETAILED DESCRIPTION

Figure 3:
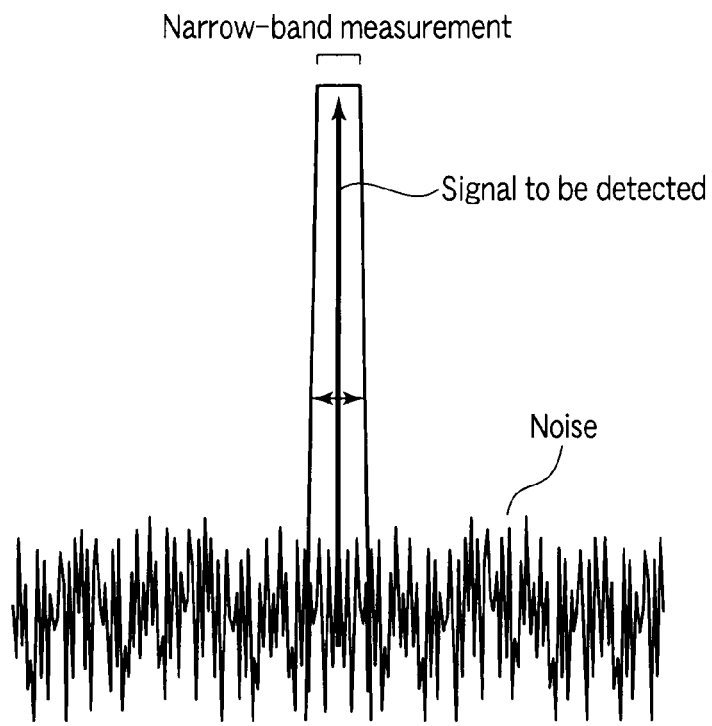
FIG. 3 is an image diagram illustrating band limiting using a prior art resonator.

In general, according to one embodiment, a magnetic resonance measuring apparatus includes a signal source, a transmitter, a receiver, a bandpass filter, a receiving circuit and a magnetic field generator. The signal generator is configured to generate a microwave signal. The transmitter is configured to transmit the signal from the signal source to a test sample. The receiver is opposed to the transmitter and configured to receive the signal from the transmitter via the test sample. The bandpass filter having a bandwidth and configured to extract the signal. The receiving circuit is configured to amplify the extracted signal through the bandpass filter and process the amplified signal. The magnetic field generator is configured to apply a magnetic field to the test sample.

In general, according to one embodiment, the bandwidth BW of the bandpass filter satisfies a condition, $P+Gtx+Grx-(\Gamma tx+\Gamma d1+\Gamma d2+\Gamma d3+\Gamma rx)>10\times\log(k\times T\times BW\times 10^9)$, where k is the Boltzmann constant, f (MHz) is the frequency of the microwave signal, P (dBm) is average power, Gtx (dBi) is the gain of the transmitter, Grx (dBi) is the gain of the receiver, $\Gamma tx$ (dB) is an attenuation from the signal generator to the transmitter, $\Gamma rx$ (dB) is an attenuation from the transmitter to the receiving circuit, d1 (m) is the distance from the transmitter to the test sample, d2 (m) is the thickness of the test sample, d3 (m) is the distance from the test sample to the receiver, $\Gamma d1$, $\Gamma d2$, and $\Gamma d3$ (dB) are attenuations at the distances, individually, and T (K) is a temperature.

According to one embodiment, there may be provided a magnetic resonance measuring apparatus of high sensitivity, capable of measuring a larger object to be evaluated.

The magnetic resonance measuring apparatus of the embodiment is an apparatus that uses magnetic resonance, such as nuclear magnetic resonance (NMR) and/or electron spin resonance (ESR) associated with an object to be detected, to inspect or measure the object to be measured.

The principle of the magnetic resonance measuring apparatus of the embodiment will now be described with reference to FIG. 1. In principle, the magnetic resonance measuring apparatus comprises a signal source 20 configured to generate a microwave signal. A transmitter 21 is connected to the signal source 20 and is configured to transmit the signal from the signal source to a test sample 22 as an object to be measured. A receiver 23 faces the transmitter 21 so that the test sample 22 is interposed between them and is configured to receive the signal from the test sample 22. A bandpass filter 24 with bandwidth BW (MHz) is connected to the receiver 23. A receiving circuit 25 is connected to the bandpass filter 24 and configured to amplify the signal received from the receiver 23 through the bandpass filter and process the amplified signal in accordance with preset data. A magnetic field generator 26 is configured to apply a magnetic field to the test sample 22.

The signal source 20 may comprise a signal source element that generates the microwave signal, an amplifier that amplifies the signal form the signal source element, and a transmitter that delivers the amplified signal to the test sample. The transmitter 21 needs only to be any conventional one, e.g., a transmitter antenna, having directivity toward a test sample.

The magnetic field generator 26 needs only to be one that can apply a magnetic field to a test sample. For example, the magnetic field generator 26 may be any one that is generally used in an NMR or ESR system.

The receiver 23 needs only to be any conventional one, e.g., a receiver antenna, capable of receiving a signal from a test sample.

The bandpass filter 24 is a means for separating a signal of a desired frequency from signals from the receiver 23. Bandwidth BW of the bandpass filter 24 needs only to satisfy the following conditions. Let it be assumed that the frequency of the microwave signal from the signal source 20 is f (MHz); average power of the signal source 20, P (dBm); gain of the transmitter 21, Gtx (dBi); gain of the receiver 23, Grx (dBi); attenuation from the signal source 20 to the transmitter 21, Γtx (dB); and attenuation from the transmitter 21 to the receiving circuit 25, Γrx (dB). Further, let it be assumed that the distance from the transmitter 21 to the test sample 22 is d1 (m); thickness of the test sample 22, d2 (m); distance from the test sample 22 to the receiver 23, d3 (m); attenuations at these distances, Γd1, Γd2, and Γd3 (dB), individually; and temperature, T (K). Thereupon, bandwidth BW of the bandpass filter 24 satisfies a condition, $P+Gtx+Grx-(\Gamma tx+\Gamma d1+\Gamma d2+\Gamma d3+\Gamma rx)>10\times\log(k\times T\times BW\times 10^9)$, where k is the Boltzmann constant. An example of the bandpass filter 24 is a superconducting filter that uses a superconducting material for wavelength demultiplexing.

The receiving circuit 25 may need only to be a circuit that can amplify the signal received from the receiver 23 through the bandpass filter 24 and process the amplified signal in accordance with the preset data. The receiving circuit 25 may generate a signal data, image date and another data to be obtained based the preset data as magnetic resonance detection data. The receiving circuit 25 may comprise a low-noise amplifier and a frequency converter, which is based on a mixer, local signal source, etc. Optionally, moreover, the receiving circuit 25 may comprise a signal processing circuit, such as a computer. Moreover, the receiving circuit 25 may comprise display means for displaying the processed signal as a magnetic resonance detection data, optionally.

The preset data for processing the amplified signal may be various formulas for converting the obtained amplified signal into a signal and/or an image to be displayed, and/or tables for correlating the amplified signal, measuring conditions and signal or image to be output, and measuring conditions, and so on. The preset data may be given to the magnetic resonance measuring apparatus of the embodiment by an operator and/or a manufacturer, and so on. The preset data may be contained in at least one of any units that functions as a memory and/or recorder of the magnetic resonance measuring apparatus of the embodiment.

Some alternative embodiments will now be described with reference to the accompanying drawings.

First Embodiment

FIG. 2 is a schematic block diagram of a magnetic resonance measuring apparatus of a first embodiment.

A magnetic resonance apparatus that uses nuclear magnetic resonance is a nuclear magnetic resonance spectrometer, while a typical one that uses electron spin resonance is an electron spin resonance spectrometer.

The magnetic resonance apparatus comprises a signal source 101 that delivers a microwave signal with frequency f (MHz) and average power P (dBm), an amplifier 102, and a transmitter antenna 103 with gain Gtx (dBi) connected to the amplifier 102. An attenuation from the amplifier 102 to the transmitter antenna 103 is assumed to be Γtx (dB). A receiver antenna 106 with gain Grx (dBi) is opposed to the transmitter antenna at distance d(m). A test sample as an object 105 to be measured is interposed between the transmitter and receiver antennas 103 and 106. Let it be assumed that the distance from the transmitter antenna 103 to the test sample is d1 (m); thickness (opposite the transmitter and receiver antennas) of the test sample, d2 (m); distance from the test sample to the receiver antenna 106, d3 (m); and attenuations at these distances, Γd1, Γd2, and Γd3 (dB), respectively. A bandpass filter 107 with bandwidth BW (MHz) is connected to the receiver antenna 106. A low-noise amplifier 108 for use as a receiving circuit, mixer 109, and signal processing circuit 111 are connected to the bandpass filter 107 in the order named. A local signal source 110 is connected to the mixer 109 and constitutes a frequency converter in conjunction with the low-noise amplifier 108 and mixer 109. The attenuation from the receiver antenna 106 to the low-noise amplifier 108 is assumed to be Γrx (dB). Further, a magnetic field generator 104 is configured to apply a magnetic field to the test sample and has a function to vary the intensity of the magnetic field.

Here a transmission and reception system comprises the signal source 101, amplifier 102, transmitter antenna 103, receiver antenna 106, bandpass filter 107, low-noise amplifier 108, frequency converter, and signal processing circuit 111. A transmission system comprises the signal source 101, amplifier 102, and transmitter antenna 103. A reception system comprises the receiver antenna 106, bandpass filter 107, low-noise amplifier 108, frequency converter, and signal processing circuit 111. The receiving circuit comprises the low-noise amplifier 108, frequency converter, and signal processing circuit 111. The frequency converter comprises the mixer 109 and local signal line 110.

The magnetic resonance measuring apparatus according to the embodiment is characterized by comprising the bandpass filter 107 with bandwidth BW that satisfies a condition, $P+Gtx+Grx-(\Gamma tx+\Gamma d1+\Gamma d2+\Gamma d3+\Gamma rx)>10\times\log(k\times T\times BW\times 10^9)$, where T (K) is a temperature. In this inequality, k is the Boltzmann constant (about $1.38\times10^{-23}$ J/K). The right-hand side of the inequality has a value of $-114+10\times\log(BW)$ (dBm) at a temperature of 300 K.

The magnetic resonance measuring apparatus of the first embodiment can evaluate the size of the object 105 to be measured without depending on the measurement frequency. In addition, it can evaluate the object 105 of more than the size of a resonator that has not conventionally been able to be evaluated. Since there is neither a loss in coupling to the resonator nor an isolator loss, moreover, the properties of the object 105 can be transmitted directly to the receiving circuit. According to the prior art, furthermore, the noise band is limited by a cavity resonator that accommodates the object 105, and a high coupling coefficient is used to reduce the loss attributable to the resonator coupling. If the coupling coefficient is 0.1, for example, the half-power width is 0.1 times as high as the resonant frequency, and an integral of noise in this frequency band is applied to the amplifier. Thus, an ESR signal from the to-be-measured object with high signal attenuation cannot be detected even if it is higher than the noise level. Since thermal noise is white noise with white characteristics, it has a constant value without regard to the frequency band.

Figure 4:
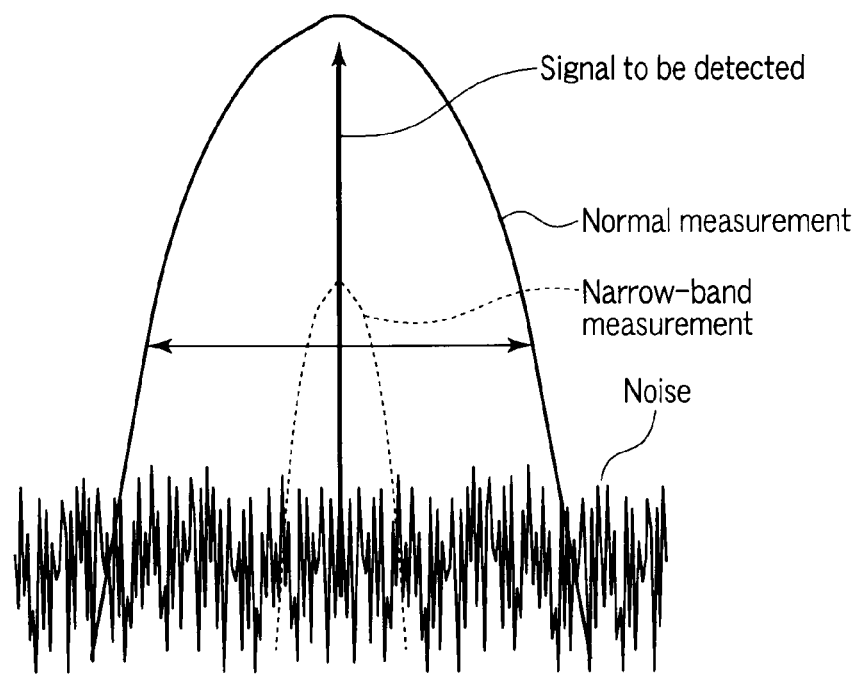
FIG. 4 is an image diagram illustrating band limiting using a narrow-band filter of the magnetic resonance measuring apparatus of the first embodiment.

According to the magnetic resonance measuring apparatus of the first embodiment, as shown in FIG. 3, the use of the above-described bandpass filter enables narrow-band filtering. Accordingly, the input of noise to the low-noise amplifier 108 can be greatly reduced by limiting the noise band. Thus, a highly sensitive magnetic resonance measuring apparatus can be constructed. In the case of the conventional magnetic resonance measuring apparatus using the resonator, a signal to be detected as indicated by a broken line in FIG. 3 also undergoes a substantial attenuation (FIG. 4) if the measurement frequency is set in a narrow band.

The bandpass filter of this type is also called a narrow-band filter.

Figure 5:
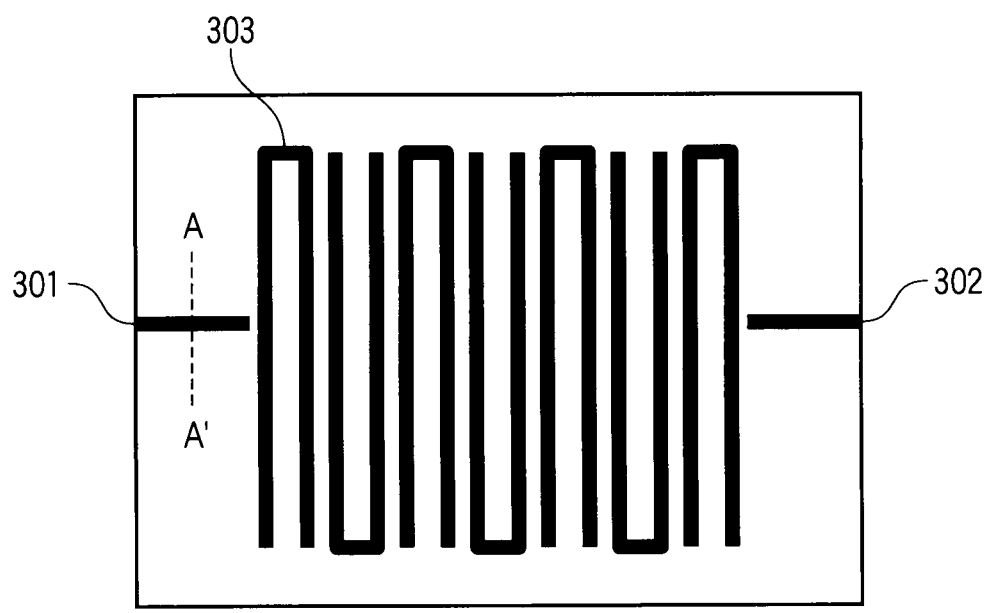
FIG. 5 is a layout example of a filter of the magnetic resonance measuring apparatus of the first embodiment using microstrip lines.
Figure 6:
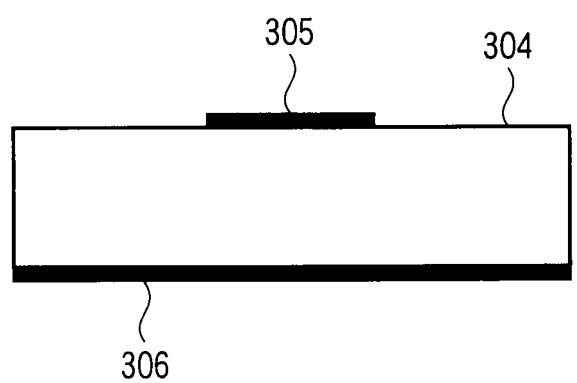
FIG. 6 is a sectional structural view showing the microstrip lines of the magnetic resonance measuring apparatus of the first embodiment.

In order to remove the influence of generation of heat by microwaves, transmission needs to be achieved with power less than the amount of thermal radiation by the object to be measured. Preferably, a superconducting filter should be used to obtain necessary reception sensitivity. Thus, noise can be reduced without entailing signal attenuations. FIG. 5 shows a layout example of the bandpass filter, and FIG. 6 is a sectional structural view taken along line A-A' of FIG. 5. The bandpass filter comprises, for example, seven hairpin resonators 303 that use microstrip lines. Each microstrip line is a conventional high-frequency waveguide, which comprises a dielectric substrate 304, input and output lines 301 and 302, and grounding conductor 306. The input and output lines 301 and 302 are signal conductors formed on a first surface of the dielectric substrate 304 so as to be located individually on the opposite sides of the resonators 303. The grounding conductor 306 is formed on a second surface of the dielectric substrate 304. The length of each hairpin resonator 303 determines the resonant frequency and central frequency in a frequency band passed by the filter. Further, the bandwidth can be determined by optimizing the distances between the input or output line 301 or 302 and the hairpin resonators 303 and between the resonators 303. The filter of this type may use superconductors for the signal conductors and grounding conductor of the superconducting filter.

The superconductors may be various materials including $Nb_3Sn$, $MgB_2$, yttrium-based high-temperature superconductor ($YBa_2Cu_3O_{7-x}$), and bismuth-based high-temperature superconductors ($Bi_2Sr_2CaCu_2O_{8+x}$, $Bi_2Sr_2Ca_2CU_3O_{10+x}$).

Figure 7:
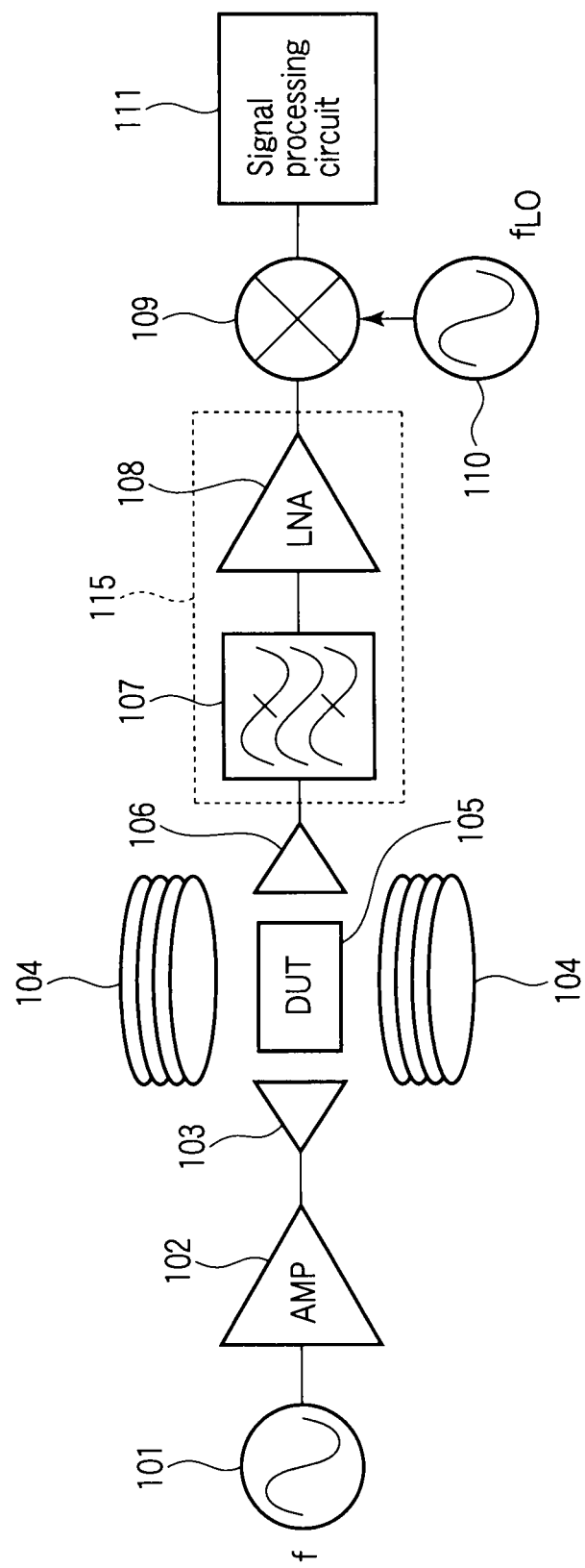
FIG. 7 is a diagram showing a specific example in which a superconducting filter and a low-noise amplifier of the magnetic resonance measuring apparatus of the first embodiment are simultaneously cooled.

As shown in FIG. 7, moreover, the low-noise amplifier 108 using a MOS transistor can also be used to assemble a highly sensitive reception system with low noise-figure characteristics by being cooled together with the superconducting filter. This is because the mobility of the material characteristics of the MOS transistor increases as the temperature drops.

If superconducting materials are also used to fabricate the receiver antenna 106 and conductors, as shown in FIG. 8, moreover, the loss from the receiver antenna 106 to the low-noise amplifier 108 is nearly zero. Therefore, a reception system with higher sensitivity can be assembled. If the low-noise amplifier 108 is formed in a multistage type, all amplifiers may be cooled. If only a first-stage amplifier is cooled, however, the same high-sensitivity characteristics can be maintained without cooling a second-stage amplifier.

Second Embodiment

FIG. 9 is a schematic block diagram showing an example of a magnetic resonance measuring apparatus of a second embodiment.

The magnetic resonance measuring apparatus of FIG. 9 comprises two or more signal sources 101 that deliver two or more different microwave signals and a combiner 113 that combines the signals. A resultant signal obtained by the combination in the combiner 113 is output from a transmitter antenna 103. The output signal is applied to a test sample 105 to be measured. The test sample 105 is placed below a magnetic field from a magnetic field generator 104. In this state, signals including a magnetic resonance signal from the test sample 105 are received by a receiver antenna 106. As described before, the receiver antenna 106 is opposed to the transmitter antenna 103, and the test sample 105 is interposed between the transmitter and receiver antennas 103 and 106. Each signal is demultiplexed by two or more frequency demultiplexers 112 that are connected to the receiver antenna 106. Demultiplexed signals are transmitted individually to frequency converters and signal processing circuits 111. Each frequency converter comprises a low-noise amplifier 108, mixer 109, and local signal line 110 that is connected to the path of each corresponding frequency demultiplexer 112.

The magnetic resonance measuring apparatus of the second embodiment can simultaneously evaluate magnetic resonance in the test sample with a plurality of frequencies as a plurality of magnetic resonance detection data. Since the resonance frequency of an electron spin varies depending on the state of the spin, a plurality of electron spin states can be evaluated by this method. The frequency demultiplexers 112 are constructed so that each bandwidth satisfies a condition, P+Gtx+Grx−(Γtx+Γd1+Γd2+Γd3+Γrx)>10×log(k×T×BW×$10^9$).

A case where a power divider is used for the combiner 113 will now be described with reference to FIG. 10. FIG. 10 shows the power divider, which is a four-way divider comprising doubled two-way Wilkinson dividers using microstrip lines.

In the power divider, an input port 1 is connected to one end of a line 601 of 50Ω, and respective one ends of two quarter-wave lines 602(1) and 602(2) of 70.7Ω are connected to the other end of the 50-Ω line 601. The respective other ends of the lines 602(1) and 602(2) are connected to each other by a resistor 603 of 50Ω, whereby a two-way divider is formed. A four-way divider is formed by doubling the two-way divider. Respective one ends of 50-Ω lines 606(1) to 606(4) are connected to quarter-wave lines 605(1) to 605(4) in a second stage. Output ports 2 to 5 are arranged at the other ends of the lines 606(1) to 606(4), respectively. Numbers 607 and 608 individually denote resistors of 50Ω.

The power divider constructed in this manner can be used as the combiner 113 of FIG. 9 by using the output ports 2 to 5 as input ports and the input port 1 as an output port.

FIG. 11 shows a case where a four-way divider is formed in serious consideration of low-loss characteristics, based on the sacrifice of isolation characteristics. An input port 11 is provided at the one end of the 50-Ω line 601, and respective one ends of four quarter-wave lines 604(1) to 604(4) of 100Ω are connected to the other end of the line 601. Lines 609(1) to 609(4) of 50Ω are connected to the other ends of the lines 604(1) to 604(4), respectively. Output ports 12 to 15 are arranged on the output side of the 50-Ω lines 609(1) to 609(4), respectively. The power divider of this type can also be used as the combiner 113. Thus, the combiner 113 can be formed by using the output ports 12 to 15 as input ports and the input port 11 as an output port.

Third Embodiment

Figure 12:
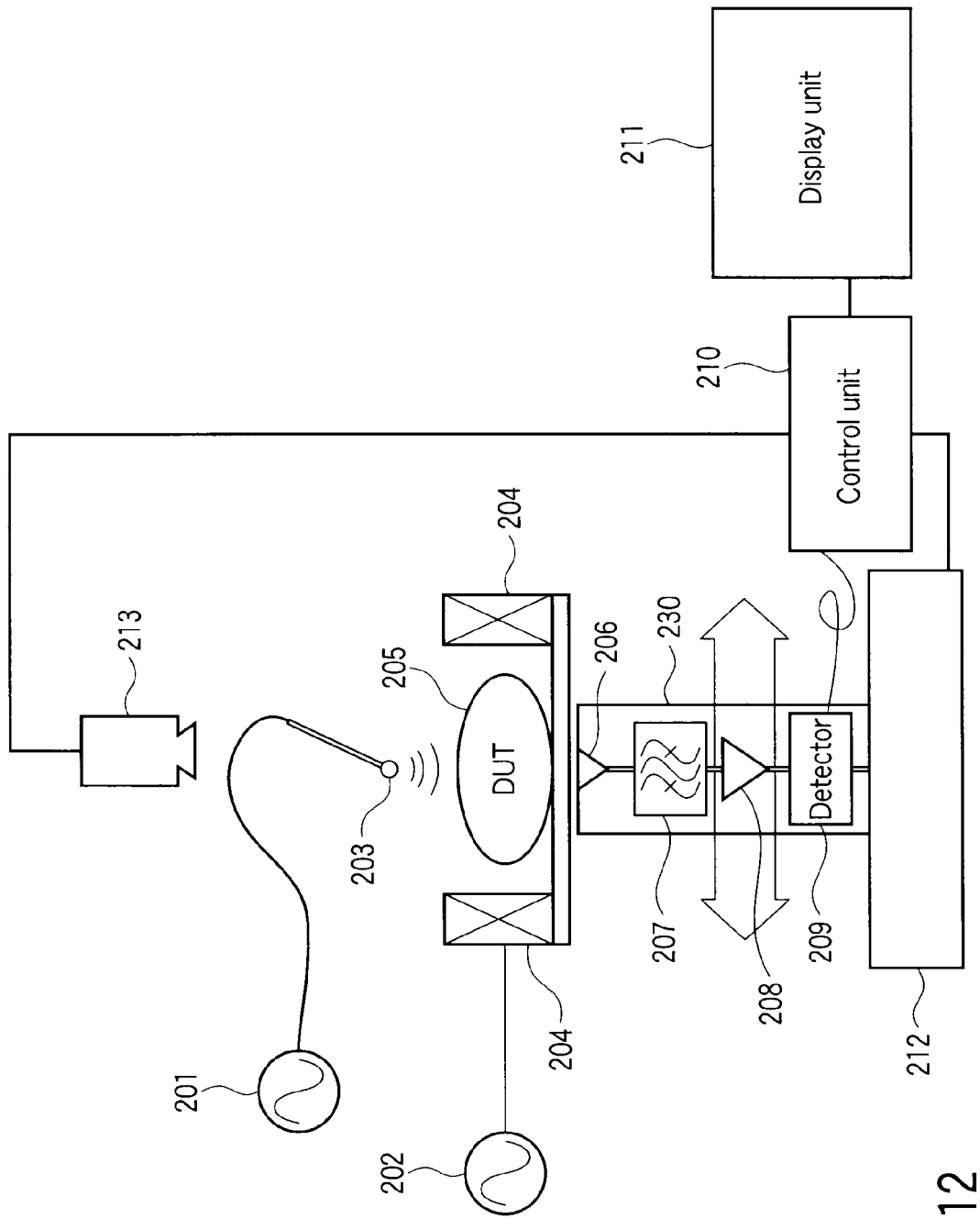
FIG. 12 is a schematic block diagram of a magnetic resonance measuring apparatus of a third embodiment.

FIG. 12 is a schematic block diagram showing an example of a magnetic resonance measuring apparatus of a third embodiment.

The magnetic resonance measuring apparatus of the third embodiment comprises a signal generator circuit for use as a signal source configured to generate microwaves and a transmission signal generator 201 comprising an amplifier for amplifying the generated microwaves. A signal delivered from the transmission signal generator 201 is transmitted to a test sample through an operable transmitter antenna 203. As this is done, an object 205 to be measured is located in a magnetic field from a magnetic field generator 204. The magnetic field generator 204 is controlled by a magnetic field modulator 202 so that the magnetic field can be modulated. A signal from the object 205 in the applied magnetic field is received by a receiver antenna 206. When this is done, position data on the transmitter antenna 203 is obtained from an image input unit 213 for use as a position data sensor, which is a means for detecting the transmitter antenna position. The position data is delivered to the control unit 210. A movable reception unit 230 moves under the control of the control unit 210 that is controlled based on the obtained position data. Specifically, a reception unit mover 212 that supports the reception unit 230 moves under the control of the control unit 210, whereupon the reception unit 230 moves and receives the signal from the object 205 to which the signal from the transmitter antenna 203 is applied in the magnetic field. The reception unit 230 comprises the receiver antenna 206 and a narrow-band filter 207, low-noise amplifier 208, and detector 209, which are successively connected to the receiver antenna 206. The signal received by the receiver antenna 206 is demultiplexed by the narrow-band filter 207. The demultiplexed signal thus obtained is amplified by the low-noise amplifier 208 and delivered to the detector 209. The detector 209 comprises a signal processing circuit and frequency converter, which is based on a mixer, local signal source, etc. In the detector 209, after the delivered signal is frequency-converted by the frequency converter to a signal of predetermined frequency, the frequency-converted signal is processed by the signal processing circuit, based on the magnitude of the signal, position data and images obtained from the image input unit 213, and previously stored data, such as programs and/or tables. The resulting data are displayed on a display unit 211.

The magnetic resonance measuring apparatus of the third embodiment can change and evaluate measured cross-sectional positions of the object 205, based on the position of signal reception from the transmitter antenna 203 by the receiver antenna 206. In each measured cross-sectional position, in this case, the magnetic field generator 204 may be controlled by means of magnetic field modulator 202 so that the magnetic field can be modulated for the evaluation. The magnetic field modulator 202 may be controlled by the control unit 210 based on the previously stored programs and/or tables or other data. Alternatively, the control may be based on data input by an operator through an input unit (not shown) connected to the control unit. The control unit may be a computer.

The detector 209 comprises a signal processing circuit, such as a computer, and frequency converter, which is based on a mixer, local signal source, etc. The signal processing circuit may be provided integrally with other constituent elements, e.g., the detector 209 and/or control unit 210, of the magnetic resonance measuring apparatus. Alternatively, the signal processing circuit may be connected as an independent element to the other constituent elements so as to be able to transmit data to and receive data from them. For example, the signal processing circuit may be a computer.

The data displayed on the display unit 211 may be a combination of an image from the image input unit 213 and evaluation data based on a measured magnetic resonance signal. For example, the display unit 211 may output the data based on a measured magnetic resonance signal as a first data together the image from the image input unit 213 as second data. In this case, the first data and the second data may be output superposed on the display. Alternatively, the first data may be a magnetic resonance detection data converted from the measured magnetic resonance signal.

The transmitter antenna may be hand-held by the operator as it is moved to a desired position. Alternatively, it may be secured to a movable support so that it can be moved to any desired position manually by the operator or under the control of a control unit.

A two-dimensional slice image or three-dimensional image may be created by the same method as for a conventional apparatus, such as an MRI. It is necessary only that a magnetic field (i.e., gradient magnetic field) with an intensity proportional to the distance be applied in addition to a static magnetic field so that data can be obtained on how the electron spin phase and frequency vary depending on the gradient magnetic field. Nothing but the resultant signal obtained by combining the individual signals is actually observed. Therefore, image data may duly be acquired by analyzing the obtained signal based on two- or three-dimensional Fourier transform so that the signal is decomposed into individual position signals (proportional to electron spins in individual positions). Based on the acquired image data, surface data of the object to be measured, included in ESR evaluation data, can be adjusted to an actual image from the image input unit and displayed superposed on separately acquired data, such as an MRI or X-ray CT. In this way, more data can be provided. In applying this function to the magnetic resonance measuring apparatus, inherently known components need only to be added to those of the magnetic resonance measuring apparatus as required.

In the example described above, the position of the transmitter antenna is determined based on the image data. Alternatively, however, any of other inherently known transmitter antenna position detection methods may be used, including a method in which a gyro is incorporated into the transmitter antenna such that displacement data can be obtained from a reference position.

Fourth Embodiment

Figures 13, 14:
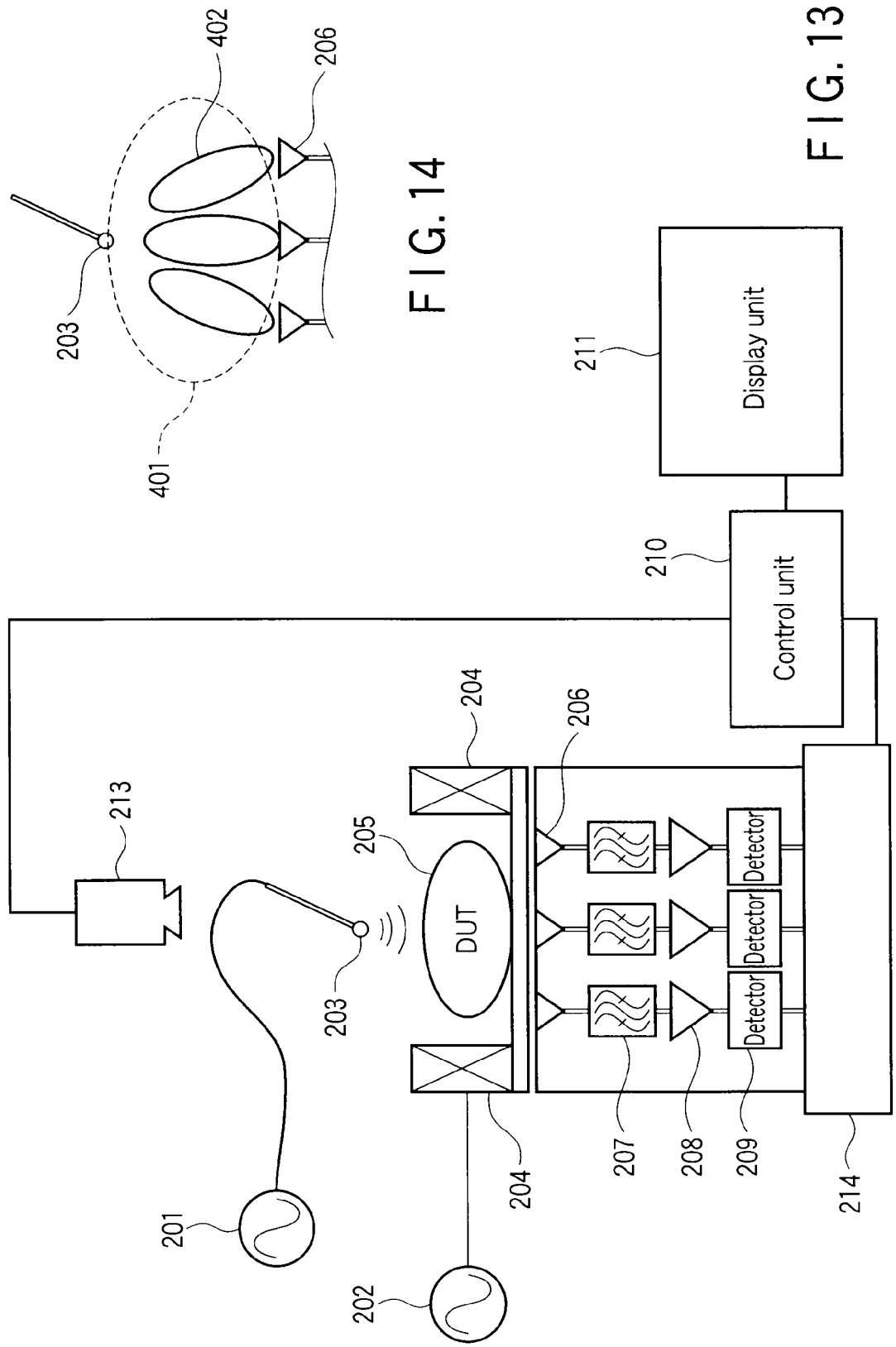
FIG. 13 is a schematic block diagram of a magnetic resonance measuring apparatus of a fourth embodiment.
FIG. 14 is an image diagram of an antenna beam pattern of the magnetic resonance measuring apparatus of the fourth embodiment under a condition, Gtx<Grx.

FIG. 13 is a schematic block diagram showing an example of a magnetic resonance measuring apparatus of a fourth embodiment.

The magnetic resonance apparatus of the fourth embodiment is an example that uses a plurality of reception units. The fourth embodiment may be constructed in the same type as the third embodiment except that it comprises a plurality of immovable reception units. The reception units are opposed to a transmitter antenna 203 so that an object to be measured is located between them. An image input unit 213 is located on the opposite side of the transmitter antenna 203 to the reception units. Each reception unit may comprise a receiver antenna 206, narrow-band filter 207, low-noise amplifier 208, detector 209, and reception unit switch 214. Two or more receiver antennas 206 may be arranged vertically and/or horizontally so as to be directed to the object 205 to be measured. Alternatively, two or more receiver antennas may be arranged vertically and/or horizontally in a circular arc around the object 205.

The receiver antennas 206 are switchable so that only the reception unit in an optimum position can receive a signal, depending on the receiver antenna position. The reception unit switch 214 may carry out such a switching under the control of the control unit 210. Thus, signals can be alternatively received by switching the operations of the reception units, based on the selection of only desired positions, without moving the reception units. The received signals serve for evaluation. The absence of movable parts enables rapid detection and evaluation. If the transmitter antenna used is based on a condition, Gtx<Grx, in particular, radio waves can be emitted from the transmitter antenna and transmitted to a wide range so that signals in individual paths can be simultaneously detected and/or evaluated as ones that are spatially separated by the receiver antennas. The transmitter antenna of this type is a useful movable probe.

FIG. 14 is an image diagram of an antenna beam pattern of the transmitter antenna. Under the condition, Gtx<Grx, a beam is transmitted to a wide range, and a received beam serve to sharply detect electric power in a narrow range. A transmitted beam from the transmitter antenna 203 spreads in a beam pattern 401. The transmitted beam pattern 401 is wider than received beam patterns 402 of the receiver antennas 206.

According to the magnetic resonance apparatus of at least one of the embodiments described above, there may be provided a magnetic resonance measuring apparatus of high sensitivity, capable of measuring a larger object to be evaluated.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A magnetic resonance measuring apparatus comprising:
a magnetic field generator configured to apply a magnetic field to a test sample;
a signal generator configured to generate a microwave signal;
a transmitter connected to the signal generator and configured to transmit the signal from the signal generator to the test sample,
a receiver opposed to the transmitter and configured to receive the signal from the transmitter via the test sample;
wherein d1 (m) is the distance from the transmitter to the test sample, d2 (m) is the thickness of the test sample and d3 (m) is the distance from the test sample to the receiver,
a bandpass filter having a bandwidth BW (MHz), connected to the receiver and configured to extract the signal with a predetermined frequency; and
a receiving circuit connected to the bandpass filter, and configured to amplify the extracted signal through the bandpass filter and process the amplified signal based on preset data,
wherein the bandwidth (BW) of the bandpass filter satisfies a condition;
$P+Gtx+Grx-(\Gamma tx+\Gamma d1+\Gamma d2+\Gamma d3+\Gamma rx)>10\times\log(k\times T\times BW\times 10^9)$,
wherein P (dBm) is average power of the microwave signal, Gtx (dBi) is the gain of the transmitter, Grx (dBi) is the gain of the receiver, $\Gamma tx$ (dB) is an attenuation from the signal generator to the transmitter, $\Gamma rx$ (dB) is an attenuation from the transmitter to the receiving circuit, $\Gamma d1, \Gamma d2,$ and $\Gamma d3$ (dB) are attenuations at the distances, individually, and T (K) is a temperature, and wherein k is the Boltzmann constant.

2. The apparatus according to claim 1, wherein the bandpass filter is a filter which uses a superconducting material for wavelength demultiplexing.

3. The apparatus according to claim 2, wherein the receiving circuit comprises a low-noise amplifier connected to the bandpass filter and wherein the bandpass filter and the low-noise amplifier are cooled in a single adiabatic vacuum container.

4. The apparatus according to claim 1, further comprising:
a position data sensor configured to detect the position and transmission direction of the transmitter; and
a position controller configured to control the position of the receiver based on the detected position and transmission direction of the transmitter.

5. The apparatus according to claim 1, further comprising:
a display unit connected to the receiving circuit, and
an image input unit connected to the display
wherein the receiving circuit further configures to output the processed signal as a first date to the display unit,
wherein the image input unit configures to obtain a second data as image from the test sample and output the second data to the display, and
wherein the display unit configures to output the first data and the second data superposed each other.

6. The apparatus according to claim 1, wherein respective gains of the transmitter (Gtx) and the receiver (Grx) satisfy a relation, Gtx<Grx.

7. The apparatus according to claim 6, wherein the transmitter is a movable probe.

8. The apparatus according to claim 1, wherein the receiving circuit comprises;
a low-noise amplifier connected to the bandpass filter and configured to amplify the signal received from the receiver through the bandpass filter,
a frequency converter connected to the low-noise amplifier and configured to frequency-convert the amplified signal to a signal of predetermined frequency,
a processor connected to the frequency converter and configured to process the frequency-converted signal based on preset data; and
wherein the bandpass filter, the low-noise amplifier, and the frequency converter are provided in two or more in number.

9. A magnetic resonance measuring apparatus comprising:
a magnetic field generator configured to apply a magnetic field to a test sample;
a first signal generator configured to generate a first microwave signal with a first frequency;
a second signal generator configured to generate a second microwave signal with a second frequency different from the first frequency;

a signal combiner connected to the first and the second signal generators and configured to combine the first and the second signals from the first and the second signal generators;

a transmitter configured to transmit a combined signal obtained in the signal combiner to the test sample;

a receiver opposed to the transmitter and configured to receive the combined signal from the transmitter via the test sample, wherein d1 (m) is the distance from the transmitter to the test sample, d2 (m) is the thickness of the test sample and d3 (m) is the distance from the test sample to the receiver;

a first bandpass filter having a first bandwidth BW1 (MHz), connected to the receiver and configured to extract the combined signal from the receiver to a first extracted signal;

a second bandpass filter having a second bandwidth BW2 (MHz), connected to the receiver and configured to extract the combined signal from the receiver to a second extracted signal;

a first receiving circuit connected to the first bandpass filter, and configured to amplify the first extracted signal and process the first amplified signal based on preset data; and a second receiving circuit connected to the second bandpass filter, and configured to amplify the second extracted signal and process the second amplified signal based on preset data, wherein the first bandwidth (BW1) of the bandpass filter satisfies a condition;

$P+Gtx+Grx-(\Gamma tx1+\Gamma d1+\Gamma d2+\Gamma d3+\Gamma rx1)>10\times\log(k\times T\times BW1\times10^9)$, wherein the second bandwidth (BW2) of the bandpass filter satisfies a condition;

$P+Gtx+Grx-(\Gamma tx2+\Gamma d1+\Gamma d2+\Gamma d3+\Gamma rx2)>10\times\log(k\times T\times BW2\times10^9)$, wherein P (dBm) is average power of the microwave signal, Gtx (dBi) is the gain of the transmitter, Grx (dBi) is the gain of the receiver, $\Gamma tx1$ and $\Gamma tx2$ (dB) are attenuations from the first and the second signal generators to the transmitter respectively, $\Gamma rx1$ and $\Gamma rx2$ (dB) are attenuations from the transmitter to the receiving circuit respectively, $\Gamma d1$, $\Gamma d2$, and $\Gamma d3$ (dB) are attenuations at the distances, individually, and T (K) is a temperature, and wherein k is the Boltzmann constant.

10. The apparatus according to claim 9, wherein both of the first and the second bandpass filter are filters which use a superconducting material for wavelength demultiplexing.

11. The apparatus according to claim 9, wherein respective gains of the transmitter (Gtx) and the receiver (Grx) satisfy a relation, Gtx<Grx.

12. The apparatus according to claim 9, wherein the transmitter is a movable probe.

13. A magnetic resonance measuring apparatus comprising:

a magnetic field generator configured to apply a magnetic field to a test sample;

a signal source configured to generate different microwave signals with two or more frequencies;

a signal combiner connected to the signal source and configured to combine the signals with two or more frequencies from the signal source;

a transmitter configured to transmit a combined signal obtained by the combination in the signal combiner to the test sample;

a receiver opposed to the transmitter and configured to receive the combined signal from the transmitter via the test sample, wherein d1 (m) is the distance from the transmitter to the test sample, d2 (m) is the thickness of the test sample and d3 (m) is the distance from the test sample to the receiver;

a plurality of frequency demultiplexers connected to the receiver and each of the frequency demultiplexers configured to isolate a signal with a predetermined frequency from the signal received by the receiver; and a plurality of receiving circuits connected individually to the frequency demultiplexers and each or the receiving circuits configured to amplify the isolated signal through the frequency demultiplexer and process the amplified signal based on preset data, wherein the bandwidth (BW) of each of the frequency demultiplexers satisfying a condition;

$P+Gtx+Grx-(\Gamma tx+\Gamma d1+\Gamma d2+\Gamma d3+\Gamma rx)>10\times\log(k\times T\times BW\times10^9)$, wherein P (dBm) is average power of the microwave signal, Gtx (dBi) is the gain of the transmitter, Grx (dBi) is the gain of the receiver, $\Gamma tx$ (dB) is an attenuation from the signal generator to the transmitter, $\Gamma rx$ (dB) is an attenuation from the transmitter to the receiving circuit, $\Gamma d1$, $\Gamma d2$, and $\Gamma d3$ (dB) are attenuations at the distances, individually, and T (K) is a temperature, and wherein k is the Boltzmann constant.

14. The apparatus according to claim 13, wherein each of the frequency demultiplexers is a filter which uses a superconducting material for wavelength demultiplexing.

15. The apparatus according to claim 14, wherein the receiving circuit comprises low-noise amplifiers connected to each of the frequency demultiplexers individually, and the frequency demultiplexers and the low-noise amplifiers are cooled in a single adiabatic vacuum container.

16. The apparatus according to claim 15, wherein respective gains of the transmitter and the receiver satisfy a relation, Gtx<Grx.

17. The magnetic resonance measuring apparatus according to claim 16, wherein the transmitter is a movable probe.

18. The apparatus according to claim 13, wherein the receiver is provided in two or more in number, and the receivers connect to the frequency demultiplexers individually.

19. A magnetic resonance measuring apparatus comprising:

a magnetic field generator configured to apply a magnetic field to a test sample;

a signal source configured to generate a microwave signal;

a transmitter connected to the signal source and configured to transmit the signal from the signal source to the test sample;

a receiver opposed to the transmitter and configured to receive the signal from the transmitter via the test sample;

a bandpass filter connected to the receiver and formed of a filter which uses a superconducting material for wavelength demultiplexing; and a receiving circuit connected to the bandpass filter and configured to amplify the signal received from the receiver through the bandpass filter and process the amplified signal based on preset data.

* * * * *